(12) United States Patent
Najafi et al.

(10) Patent No.: US 6,884,732 B2
(45) Date of Patent: Apr. 26, 2005

(54) METHOD OF FABRICATING A DEVICE HAVING A DESIRED NON-PLANAR SURFACE OR PROFILE AND DEVICE PRODUCED THEREBY

(75) Inventors: Khalil Najafi, Ann Arbor, MI (US); Chou Tsung-Kuan, San Jose, CA (US)

(73) Assignee: The Regents of the University of Michigan, Ann Arbor, MI (US)

( * ) Notice: Subject to any disclaimer, the term of this patent is extended or adjusted under 35 U.S.C. 154(b) by 142 days.

(21) Appl. No.: 10/269,256

(22) Filed: Oct. 11, 2002

(65) Prior Publication Data

US 2003/0139014 A1 Jul. 24, 2003

Related U.S. Application Data

(60) Provisional application No. 60/329,633, filed on Oct. 15, 2001.

(51) Int. Cl.$^7$ ............................................. H01L 21/302

(52) U.S. Cl. ........................... 438/713; 438/50; 438/52; 438/459; 438/709; 438/712; 438/719; 438/974; 438/977

(58) Field of Search ........................... 438/50, 52, 459, 438/974, 977

(56) References Cited

U.S. PATENT DOCUMENTS

| | | | |
|---|---|---|---|
| 5,969,250 A | * 10/1999 | Greiff | 73/514.38 |
| 6,106,245 A | 8/2000 | Cabuz | |
| 6,136,630 A | * 10/2000 | Weigold et al. | 438/50 |
| 6,148,635 A | 11/2000 | Beebe et al. | |
| 6,465,355 B1 | * 10/2002 | Horsley | 438/694 |
| 2001/0044165 A1 | 11/2001 | Lee et al. | |

OTHER PUBLICATIONS

Legtenberg, Rob, et al., Electrostatic Curved Electrode Actuators, Journal of Microelectromechanical Systems, Sep. 1997, vol. 6, No. 3, pp. 257–265.

Sherman, Faiz, et al., In–Plane Microactuator For Fluid Control Application, Proc. MEMS 1998, pp. 454–459.

Cabuz, Cleopatra, et al., The Dual Diaphragm Pump, Proc. MEMS 2001, Minnesota, pp. 519–522.

Gimkiewicz, Christiane, et al., Fabrication of Microprisms For Planar Optical Interconnections By Use of Analog Gray– Scale Lithography With High–Energy–Beam–Sensitive Glass, Applied Optics, May 10, 1999, vol. 38, No. 14, pp. 2986–2990.

(Continued)

*Primary Examiner*—Long Pham
*Assistant Examiner*—Wai-Sing Louie
(74) *Attorney, Agent, or Firm*—Brooks Kushman, P.C.

(57) ABSTRACT

A method of fabricating a device having a desired non-planar surface or profile and device produced thereby are provided. A silicon wafer is first coated with silicon nitride, patterned, and DRIE to obtain the desired etch profile. Silicon pillars between trenches are then etched using an isotropic wet etch, resulting in a curved well. The wafer is then oxidized to ~2 μm to smooth the surface of the well, and to protect the well from an ensuing planarization process. The nitride is then selectively removed, and the wafer surface is planarized by removing the Si left in the field regions using either a maskless DRIE or CMP. Finally, the oxide is etched away to produce a wafer with a curved surface.

20 Claims, 4 Drawing Sheets

OTHER PUBLICATIONS

Jansen H., et al., RIE Lag In High Aspect Ratio Trench Etching Of Silicon, Microelectronic Engineering, vol. 35, 1997, pp. 45–50.

Selby, J.C., et al., Sub–Micrometer Solid–State Adhesive Bonding With Aromatic Thermosetting Copolyesters For The Assembly of Polyimide Membranes In Silicon–Based Devices, Institute of Physics Publishing, Journal of Micromechanics And Microengineering, 2001, vol. 11, pp. 672–685.

Gottscho, Richard A., et al., Microscopic Uniformity In Plasma Etching, American Vacuum Society, Sep./Oct. 1992, pp. 2133–2147.

Bourouina, Tarik, et al. The MEMSNAS Process: Microloading Effect For Micromachining of 3D Structures With Nearly Arbitrary Shape, IEEE/LEOS Optical MEMS 2001, Sep. 25–28, 2001, Okinawa, Japan.

* cited by examiner

METHOD OF FABRICATING A DEVICE HAVING A DESIRED NON-PLANAR SURFACE OR PROFILE AND DEVICE PRODUCED THEREBY

CROSS-REFERENCE TO RELATED APPLICATION

This application claims the benefit of U. S. provisional application Ser. No. 60/329,633, filed Oct. 15, 2001.

STATEMENT REGARDING FEDERALLY SPONSORED RESEARCH OR DEVELOPMENT

This invention was made with Government support under DARPA Grant No. N00019-98-K-0111. The Government has certain rights in the invention.

BACKGROUND OF THE INVENTION

1. Field of the Invention

This invention relates to methods of fabricating a device having a desired non-planar surface or profile and devices produced thereby.

2. Background Art

Several MEMS applications require a non-planar surface topography, including high performance electrostatic actuators and optical components. For example, an electrostatically-driven parallel-plate actuator can provide a much larger vertical deflection with a low voltage if the drive electrode is curved. In this structure, a large force is created around the edges of the diaphragm (closest to electrode) to deflect it toward the electrode, while a large deflection (>10 $\mu$m) can be obtained in the middle of the diaphragm (farthest from electrode).

The optimal electrode shape for an electrostatic curved actuator should maximize diaphragm displacement while minimizing drive voltage and diaphragm bending stress. Legtenberg suggests that higher order curvature profiles require lower pull-in voltages in R. Legtenberg et al., "Electrostatic Curved Electrode Actuators," J. MICROELECTROMECH. SYST., Vol. 6, No. 3,pp. 257–265, 1997.

Devices, such as microactuators for fluid control application, have utilized in-plane curved electrode configuration in order to achieve large beam displacement at tip. F. Sherman et al., "In-Plane Microactuator for Fluid Control Application," PROC. MEMS '98, pp. 454–459, 1998.

Micropumps with diaphragm driven by out-of-plane curved electrode have been used to achieve high air pumping rate. C. Cabuz et al., "The Dual Diaphragm Pump," PROC. MEMS '01, pp. 519–522, 2001.

However, curved electrodes cannot be batch-fabricated for those devices since it is difficult to batch fabricate an out-of-plane curved surface on the wafers.

Past attempts at making out-of-plane curved surfaces utilized gray-scale optical masks to create photoresist with a prism profile. C. Gimkiewicz et al., APPLIED OPTICS, Vol. 38, No. 14, pp. 2986–2990, 1999. This pattern is then transferred onto Si using RIE. However, this technique requires well controlled photolithography and stable RIE selectivity between photoresist and Si. More importantly, gray-scale optical masks are extremely expensive, especially when a very fine gray-scale is required.

Silicon DRIE is well known for its feature size-dependent etch rate when the aspect-ratio is >2,as illustrated by H. Jansen et al., MICROELECTRONIC ENGN., Vol. 35, pp. 45–50, 1997. In most cases, this is undesirable since it results in uneven etch depth for different openings.

SUMMARY OF THE INVENTION

An object of the present invention is to provide a simple and versatile method of fabricating a device having a desired non-planar surface or profile and device produced thereby.

Yet another object of the present invention is to provide a method of fabricating a device having a desired non-planar surface or profile and device produced thereby wherein the fabrication can be done in a batch process.

In carrying out the above objects and other objects of the present invention, a method of fabricating a device having a desired non-planar surface or profile is provided. The method includes the steps of providing a substrate including a field region having a plurality of spatially-arranged open areas and selectively removing material from the plurality of open areas at different rates to form the desired non-planar surface or profile.

The plurality of open areas may have different dimensions wherein the different rates are based on the different dimensions. The open areas may have aspect ratios greater than 2. Each of the open areas may have a width less than 50 micrometers.

The plurality of open areas may have different materials wherein the different rates are based on the different materials.

The open areas may be separated by at least one microstructure. The method may further include selectively removing the at least one microstructure to obtain a substantially continuous non-planar field region on the substrate.

The non-planar field region may include a smooth curved surface and/or an abrupt non-planar profile.

The method may further include smoothing the substantially continuous non-planar region to obtain a smoothed field region.

The method may further include removing material from an area surrounding the smoothed field region to planarize the area surrounding the smoothed field region.

The desired non-planar surface may be a profile formed in a single etching step.

The device may be a microactuator such as a drive electrode having a curvature which is a high order sinusoidal curvature.

The drive electrode may be perforated.

The substrate may be a semiconductor substrate such as a silicon substrate.

Further in carrying out the above objects and other objects of the present invention, a device fabricated in accordance with the above method is provided.

The above objects and other objects, features, and advantages of the present invention are readily apparent from the following detailed description of the best mode for carrying out the invention when taken in connection with the accompanying drawings.

BRIEF DESCRIPTION OF THE DRAWINGS

FIGS. 1a–1c are side schematic views of various drive electrodes wherein FIG. 1a also includes a diaphragm to be vertically electrostatically driven by the curved actuator or drive electrode and wherein FIGS. 1b and 1c show other desirable curved surfaces;

DETAILED DESCRIPTION OF THE PREFERRED EMBODIMENTS

In general, a method of the present invention creates a non-planar surface using etch lag effect phenomenon or etch rate dependent process on any material. This method can be used to form any arbitrary etched surface or bottom profile by a single masking and process step, multiple masking and process steps, or any combination numbers of masking and processing steps. One can expose and etch a field region on a substrate, which contains some spatially arranged open areas with different etching rates to the etchant chemicals individually. This etch rate dependence can be the natural etching phenomenon due to any causes of the area to be etched or the artificial result caused by adding other materials on top or within to change the etch properties spatially.

The etchants can be dry or wet chemicals, or a combination of both during multiple etching steps. After the material (substrate) is etched by the etchants, it results in the overall field region as a non-planar finishing etched surface or bottom profile. Further treatment (e. g., wet etch, dry etch, or mechanical polishing can be used to remove the unwanted parts, such as the solid spacing between adjacent etched open areas, to obtain a continuous (non-isolated) non-planar field region on the substrate. This field region can be either a smooth curved surface, an abrupt non-planar profile, or a combination of both depending on the dimensions of the open areas to be etched, spaces between them, method used to obtain the etch rate dependent effect, and the etchants and processes to be used.

To demonstrate this method, the Deep Reactive Ion Etch (DRIE) lag effect phenomenon is used to fabricate an out-of-plane curved surface. The etch lag effect here is basically an etching rate dependent phenomenon observed when the etch open area/size varies on the substrate. By arranging the spatial locations of different etch areas with various dimensions, one can fabricate any desired overall etch shapes at the bottom of the field region. A further process can be used to remove any unwanted region, such as solid walls (pillars) between etched trenches. As a result, one can obtain a uniform and curved etching profile at the bottom. Depending on the application, one can also bring this curved etched profile to the surface of the substrate using extra process steps. The following illustrates detailed example procedures on the creation of an out-of-plane curved surface.

Figure 1A:
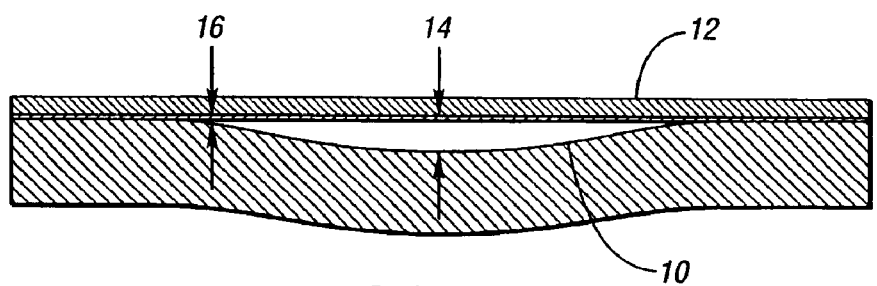

Referring now to the drawing figures, FIG. 1a illustrates a driving technique using a curved electrostatic electrode 10 fabricated in accordance with the present invention. A diaphragm 12 is spaced from the electrode 10 to form a relatively large gap 14. A large force 16 is created around the edges of the diaphragm 12 (closest to the electrode 10) to deflect the diaphragm 12 toward the electrode 10, while a large deflection (>10 $\mu$m) can be obtained in the middle of the diaphragm 12 (farthest from the electrode 10). When the electrostatic force is larger than the diaphragm restoring force, "zipping" action of the diaphragm 12 initiates from the edge. Since the air gap is much smaller, the required drive voltage can be reduced while the diaphragm center displacement can be maximized. While FIG. 1a shows the diaphragm 12, it is to be understood that instead of the diaphragm 12, a bridge or a cantilever structure could be provided.

Figure 1B:
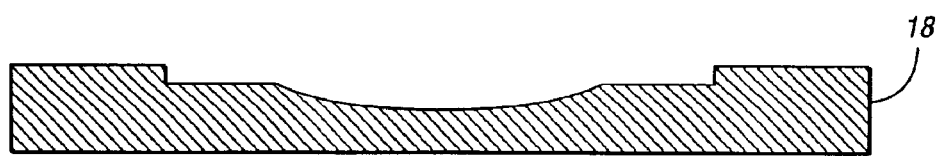
Figure 1C:
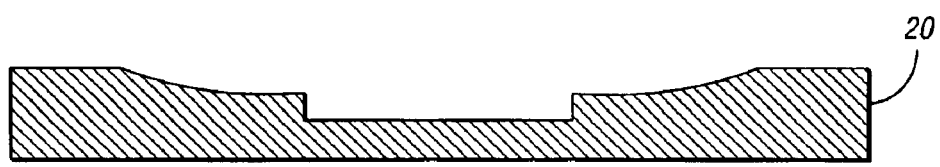

FIGS. 1b and 1c illustrate alternative shapes for the electrostatic actuator by electrodes 18 and 20, respectively.

Figure 2A:
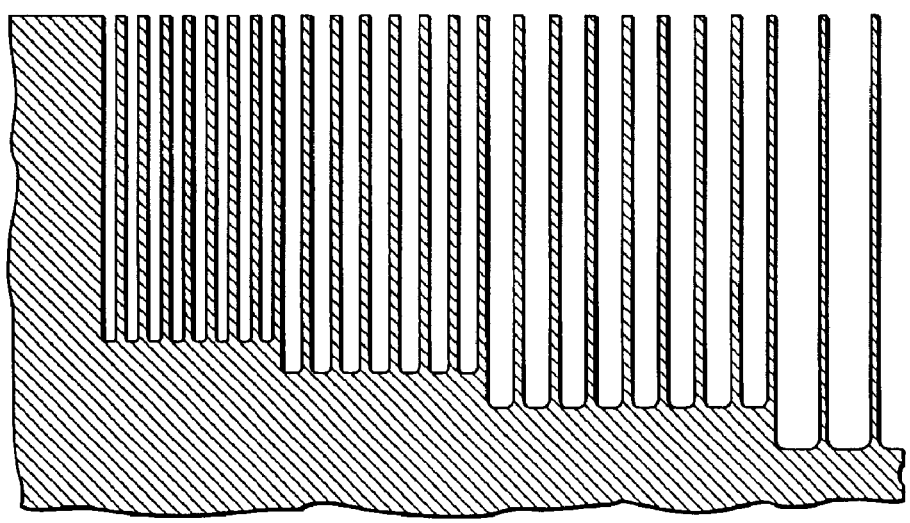
FIG. 2a is an illustration of a test Si sample etched in DRIE.

FIG. 2a illustrates an Si substrate etched in DRIE which results in uneven etch depth for different sized openings. As described below, this effect is utilized in the method of the invention to manipulate the overall bottom profile of an etched region. By using this technique, a desired curvature can be created by changing the size of adjacent openings.

Figure 2B:
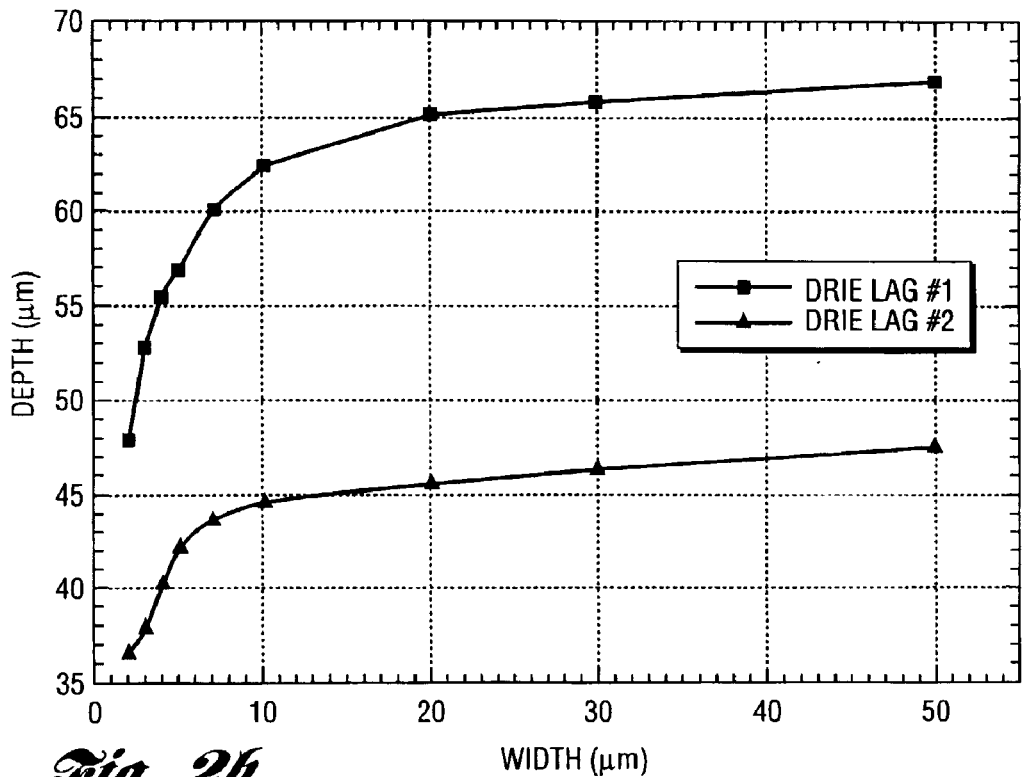
FIG. 2b is a graph which illustrates lag behavior in an STS DRIE for different etch depths.

Before fabricating the curved surface, a series of tests are carried out to characterize the lag behavior in an STS DRIE for different etch depths. The results are shown in the graphs of FIG. 2b. The lag effect becomes pronounced for opening widths smaller than 10 $\mu$m, and thus, a large variation on the bottom etch profile can be obtained by changing the trench width. The measured data is then used as a reference for the curvature designs. This method has been found to achieve curved surface with extremely fine resolution, thus allowing one to create almost perfect curved surfaces of arbitrary shape.

The optimal electrode shape for an electrostatic curved actuator should maximize diaphragm displacement while minimizing drive voltage and diaphragm bending stress. As previously mentioned, Legtenberg suggests that higher order curvature profiles require lower pull-in voltages.

Figure 3:
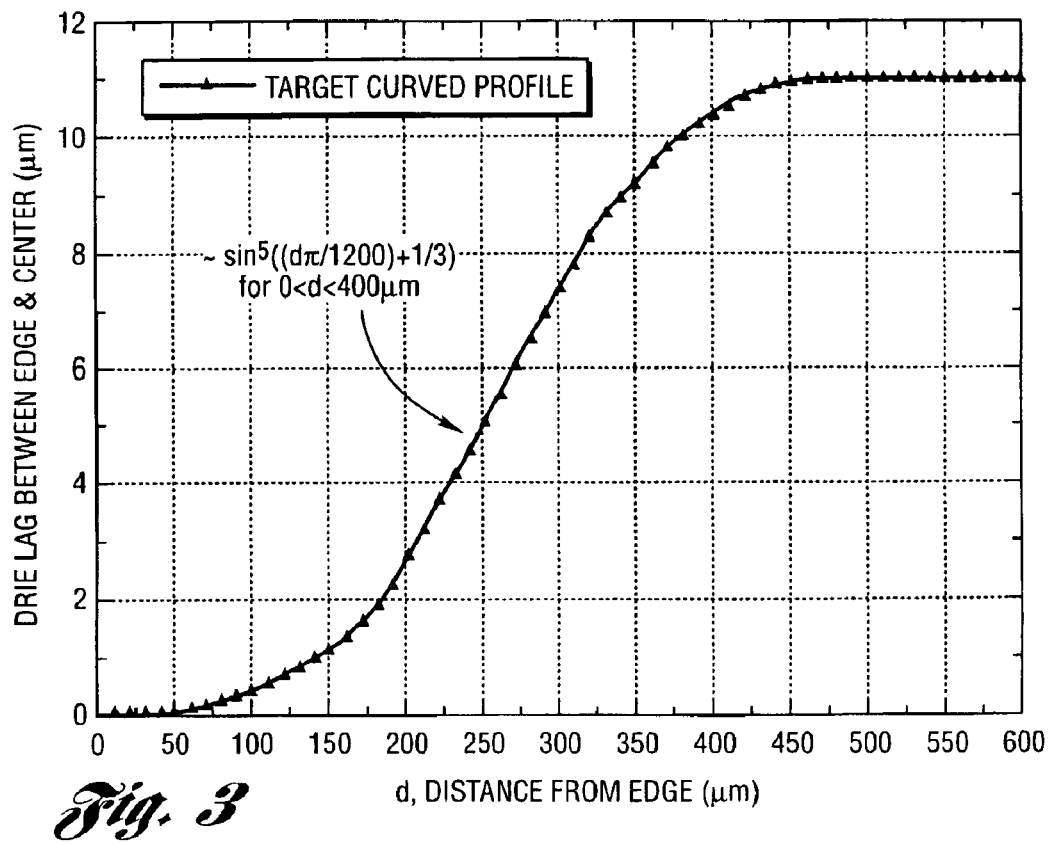
FIG. 3 is a graph which illustrates the optimal shape of a curved surface profile (i. e., high order sinusoidal curvature)

Thus, a high-order sinusoidal curvature is targeted for the drive electrode 10, as shown in FIG. 3. This curvature will evenly distribute the stress over the entire diaphragm 12 when it collapses onto the electrode 10, thus improving lifetime and maximizing deflection. A 1200 $\mu$m×1200 $\mu$m test curved surface has been designed and fabricated using trench widths ranging from 2 $\mu$m to 50 $\mu$m using this technology.

Figure 4A:
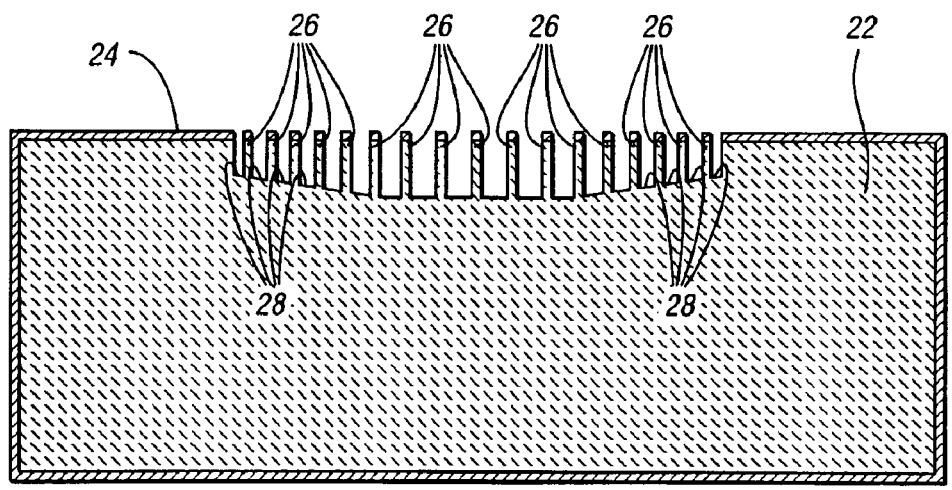
FIGS. 4a–4e are side schematic views of a substrate which show the process sequence for fabricating a curved surface utilizing Si RIE lag.

The fabrication procedure is illustrated in FIGS. 4a–4e. As shown in FIG. 4a, a 4" (100) silicon wafer 22 is first deposited with a 250 nm LPCVD silicon nitride layer 24. This nitride layer 24 prevents surface oxidation later on in the process similar to the standard LOCOS process in CMOS fabrication. Trench patterns are etched through the nitride layer 24 by RIE and then further etched by Si DRIE to obtain the desired bottom curved profile.

Figure 4B:
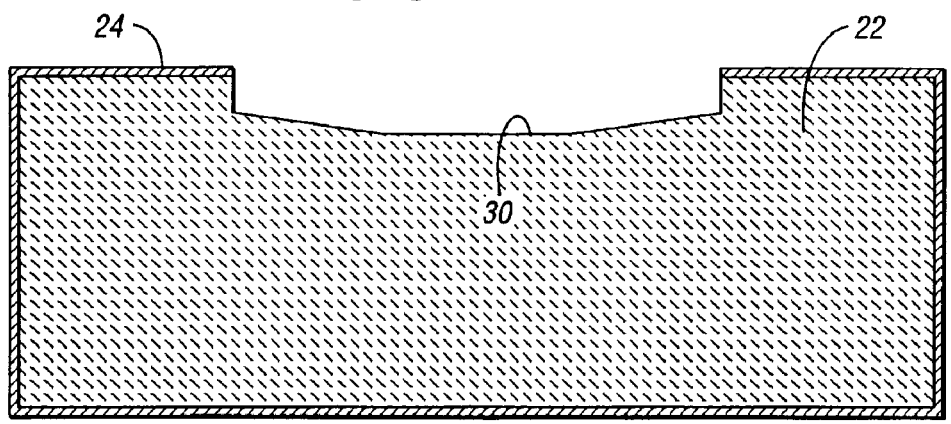

Silicon pillars 26 between trenches 28 are then etched using an isotropic dry etch or wet etch, resulting in a curved well 30 as shown in FIG. 4b.

Figure 4C:
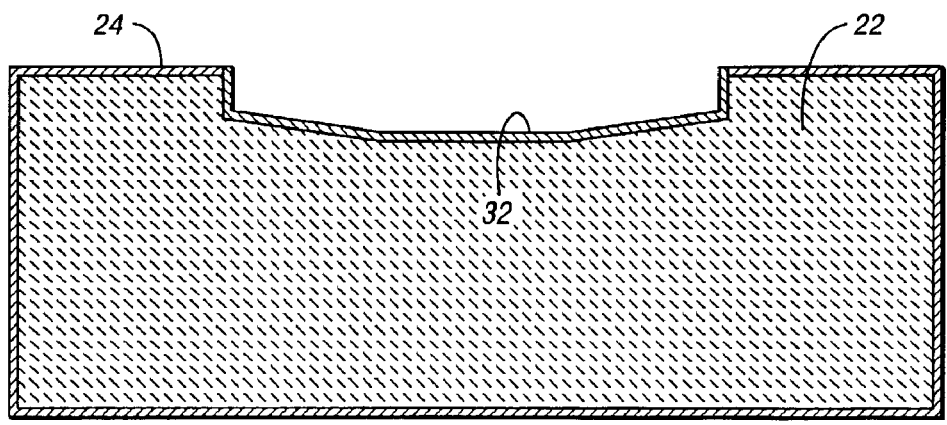

The wafer 22 is then thermally oxidized to ~2 $\mu$m, as shown in FIG. 4c, to smooth the surface of the well 30, and to protect the well 30 from the ensuing planarization process with an oxide layer 32.

Figure 4D:
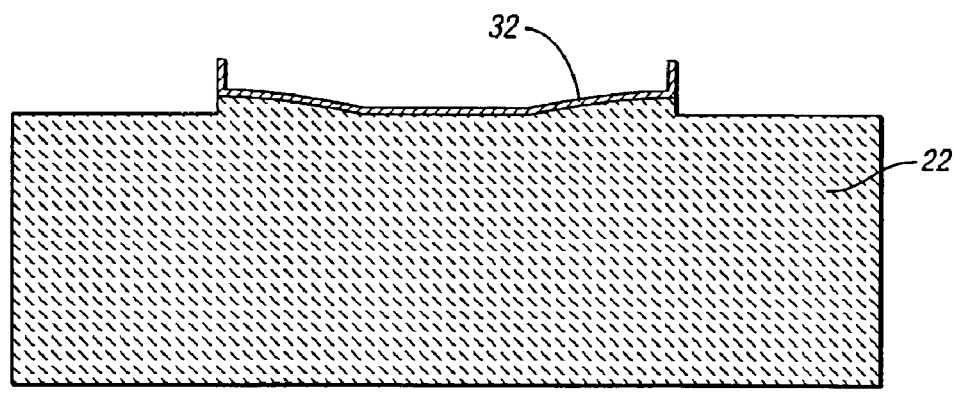

The protective nitride layer 24 in the field region is then selectively removed by hot phosphoric acid, and the wafer surface is planarized by removing the Si left in the field regions using either a maskless DRIE or CMP, as shown in FIG. 4d.

In order to use this curved surface as a drive electrode for actuation, a diaphragm should be as close as possible to the curved surface at the peripherals when bonded. However, since BCB is used to bond the wafers (as described hereinbelow), its thickness will result in a finite air gap at the edge, which will reduce the electrostatic force for device actuation. To overcome this problem, a further Si etch is performed so that the peripherals of curved surface are higher than the field regions by 3~7 μm. This step is then able to accommodate the BCB thickness and thus the zero air gap at the edge can be achieved. Dielectric layers will be on both the curved electrode and diaphragm. The actual electrode static force at the edge will depend on the dielectric thickness.

Figure 4E:
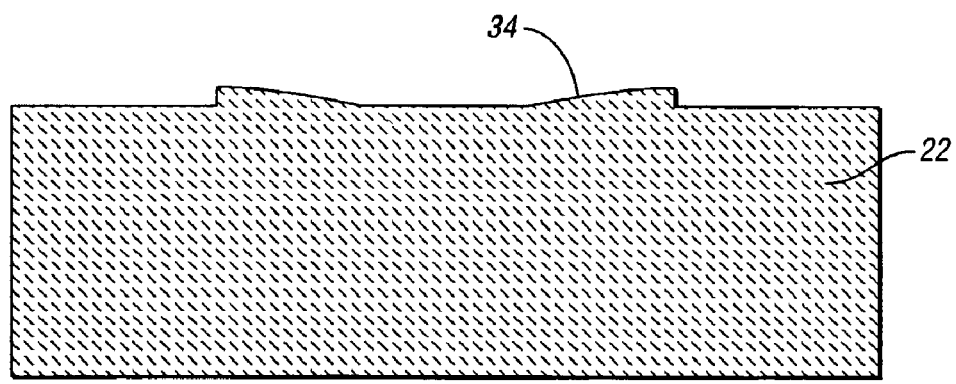

Finally, the oxide layer 32 is etched away to produce a silicon wafer 22 with a curved surface profile 34, as shown in FIG. 4e. A surface roughness less than 0.3 μm can be achieved after the oxide layer 32 is removed. In this structure, the height of the well 30 at its deepest point is about 15 μm.

Figure 5:
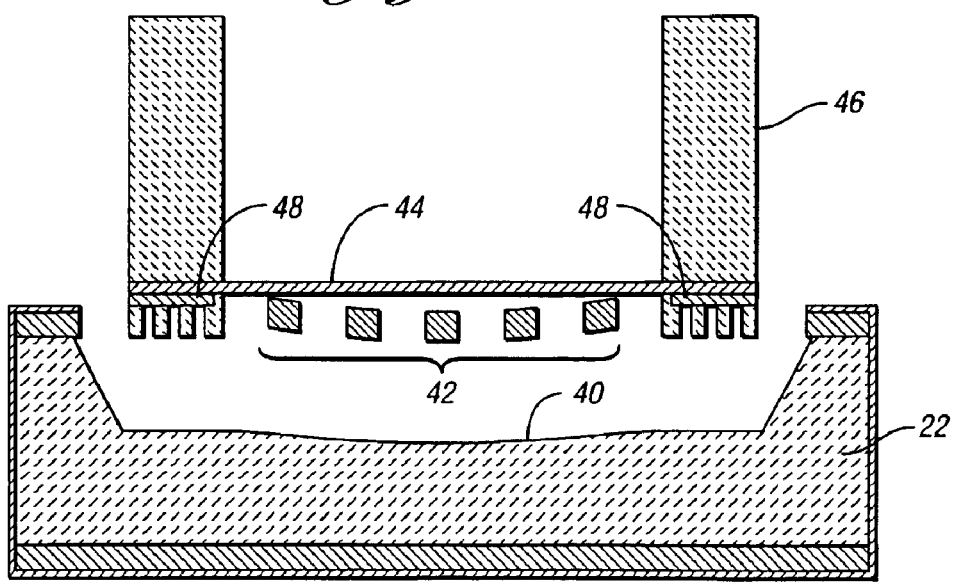
FIG. 5 is a side schematic view of a micromachined acoustic ejector with a curved perforated electrode and a thin diaphragm.

To construct a device with a curved electrode, the fabricated wafer 22 with the curved surface 34 can then be used for the formation of a cavity 40 with integrated curved electrode 42 on top, as shown in FIG. 5. The wafer 22 is first deep-boron diffused. The oxide dielectric deposition (~150 nm), electrode perforation (~65 μm), cavity formation, and electrode release is then realized by a combination of silicon DRIE and anisotropic wet etch in 10% TMAH at 85° C. for 50 minutes. Since the electrode 42 is curved, its inherent stiffness in the bending direction toward a diaphragm 44 is higher than a flat electrode with the same thickness. Therefore, by using the curved shape, the electrode 42 will deflect less and the resultant diaphragm displacement will be maximized as well. Meanwhile, since the drive electrode thickness can be reduced due to its stiffer structure, air damping through perforation holes in the electrode 42 can be reduced accordingly.

Finally, an actuator with curved electrode actuation is fabricated by localized bonding a diaphragm wafer 46 to the curved electrode wafer 22 using BCB 48. The final structure is released by Si DRIE. The diaphragm 44 forms a small air gap at the periphery of the curved electrode 42. The BCB thickness is fully housed in the down step created besides the curved surface so that the diaphragm 44 can directly rest on the drive electrode 42 with zero air gap at the edges. The diaphragm 44 can deflect up to 15 μm at center.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention. For example, this invention covers any material to be used and any etch lagging or etch rate dependent effects observed naturally or created artificially. It is not limited to the illustration described herein.

What is claimed is:

1. A method of fabricating a device having a desired non-planar surface or profile, the method comprising:

providing a substrate including a field region having a plurality of spatially-arranged open areas; and selectively removing material from the plurality of open areas at different rates to form the desired non-planar surface or profile, wherein the selectively removing comprises, etching a plurality of trench patterns in the substrate using deep reactive ion etching (DRIE) to form pillars of different heights, wherein bottoms of the trench patterns form the desired non-planar surface or profile, and removing the pillars of the trench patterns to form the desired non-planar surface or profile.

2. The method as claimed in claim 1, wherein the plurality of open areas have different dimensions and wherein the different rates are base on the different dimensions.

3. The method as claimed in claim 2, wherein the open areas have aspect ratios greater than 2.

4. The method as claimed in claim 3, wherein each of the open areas has a width less than 50 micrometers.

5. The method as claimed in claim 1, wherein the plurality of open areas have different materials and wherein the different rates are based on the different materials.

6. The method as claimed in claim 1, wherein the open areas are separated by at least one microstructure and wherein the method further comprises selectively removing the at least one microstructure to obtain a substantially continuous non-planar field region on the substrate.

7. The method as claimed in claim 6, wherein the non-planar field region includes a smooth curved surface.

8. The method as claimed in claim 6, wherein the non-planar field region includes an abrupt non-planar profile.

9. The method as claimed in claim 6, further comprising smoothing the substantially continuous non-planar region to obtain a smoothed field region.

10. The method as claimed in claim 9, further comprising removing material from an area surrounding the smoothed field region to planarize the area surrounding the smoothed field region.

11. The method as claimed in claim 1, wherein the desired non-planar surface is a profile formed in a single etching step.

12. The method as claimed in claim 1, wherein the device is a microactuator.

13. The method as claimed in claim 12, wherein the microactuator is a drive wafer electrode having a curvature.

14. The method as claimed in claim 13, wherein the curvature is a high order sinusoidal curvature.

15. The method as claimed in claim 13, wherein the drive electrode is perforated.

16. The method as claimed in claim 1, wherein the substrate is a semiconductor substrate.

17. The method as claimed in claim 16, wherein the semiconductor substrate is a silicon substrate.

18. A device fabricated in accordance with the method of claim 1.

19. The method as claimed in claim 1 wherein tops of the trench patterns are substantially level at the top of the substrate.

20. The method as claimed in claim 1 further comprising removing a first layer of the substrate using RIE prior to etching the plurality of trench patterns.

* * * * *